United States Patent
Belady (10) Patent No.: US 7,236,363 B2
(45) Date of Patent: Jun. 26, 2007

(54) LIQUID COOLED SYSTEM MODULE

(75) Inventor: Christian L. Belady, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 315 days.

(21) Appl. No.: 10/667,714

(22) Filed: Sep. 22, 2003

(65) Prior Publication Data

US 2005/0061541 A1    Mar. 24, 2005

(51) Int. Cl.
*H05K 7/20* (2006.01)
(52) U.S. Cl. .................... 361/699; 361/701; 361/689
(58) Field of Classification Search ................ 174/252; 361/689, 698, 699, 701, 714
See application file for complete search history.

(56) References Cited

U.S. PATENT DOCUMENTS

| | | | |
|---|---|---|---|
| 5,131,859 A | 7/1992 | Bowen et al. | |
| 5,271,239 A | 12/1993 | Rockenfeller et al. | |
| 5,365,749 A | 11/1994 | Porter | |
| 5,675,473 A * | 10/1997 | McDunn et al. | 361/699 |
| 5,740,018 A * | 4/1998 | Rumbut, Jr. | 361/720 |
| 6,029,742 A | 2/2000 | Burward-Hoy | |
| 6,285,550 B1 | 9/2001 | Belady | |
| 6,308,776 B1 | 10/2001 | Sloan et al. | |
| 6,377,453 B1 | 4/2002 | Belady | |
| 6,377,458 B1 | 4/2002 | Morris et al. | |
| 6,434,001 B1 | 8/2002 | Bhatia | |
| 6,452,789 B1 | 9/2002 | Pallotti et al. | |
| 6,453,269 B1 * | 9/2002 | Quernemoen | 702/186 |
| 6,496,375 B2 | 12/2002 | Patel et al. | |
| 6,507,492 B2 | 1/2003 | Morris et al. | |

* cited by examiner

*Primary Examiner*—Tuan Dinh
*Assistant Examiner*—Ivan Carpio (57) ABSTRACT

Example sealed electronics modules are described. The sealed electronics module may include electronics components. The sealed electronics module may also include one or more connectors configured to provide one or more detachable liquid connections to a liquid transporting apparatus. The liquid transporting apparatus may provide liquid communication between the sealed electronics module and an external liquid cooling module. The sealed electronics module may also include an apparatus for the cooling electronics components in the electronics module using liquid that is transported between the sealed electronics module and the external liquid cooling module.

3 Claims, 11 Drawing Sheets

LIQUID COOLED SYSTEM MODULE

TECHNICAL FIELD

The example systems and methods described herein relate generally to heat dissipation in electronics (e.g., computer) systems and to modules employed in liquid cooled system architectures.

BACKGROUND

Conventionally, electronics systems like computer systems have been air cooled. Some systems have been liquid cooled. Migration paths between air cooled and liquid cooled systems have been restricted. This has limited system architecture design, which has in turn limited scaling and interchangeability in installed systems. Additionally, electronics design has been intertwined with heat dissipation design, further limiting design options.

BRIEF DESCRIPTION OF THE DRAWINGS

The accompanying drawings, which are incorporated in and constitute a part of the specification, illustrate various example systems that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Electronics systems (e.g., computers) generate heat. Generally, electronics systems benefit from having this heat dissipated so that the electronics systems do not overheat. The heat may be dissipated by, for example, air, liquid, and so on. The example systems described herein facilitate designing electronic modules without considering whether the destination environment is air conditioned or liquid conditioned. Some electronics systems are located close together (e.g., mounted in racks). In a rack mounted configuration, an air path that had been available to dissipate heat from an electronic module may be blocked when another module is added to the rack. This can limit the size, type, number and so on of modules that can be mounted in a rack. Similarly, a rack located in a facility with a finite air conditioning capacity may not be able to house certain configurations due to the air conditioning limitations.

Some computer architectures can benefit from having electronics densely packed together in a module, which may generate large amounts of heat. Other computer architectures may benefit by having communicating, cooperating computer modules racked together to shorten connection path lengths and so on. But racking things together can also concentrate generated heat and potentially overwhelm the air conditioning capacity of a facility. Thus some architectures may benefit from liquid cooling modules. In one example, the liquid cooled modules can be located together with the electronics modules in, for example, a rack mounted system.

The following includes definitions of selected terms employed herein. The definitions include various examples and/or forms of components that fall within the scope of a term and that may be used for implementation. The examples are not intended to be limiting. Both singular and plural forms of terms may be within the definitions.

An "operable connection", or a connection by which entities are "operably connected", is one in which signals, physical communication flow, and/or logical communication flow may be sent and/or received. Typically, an operable connection includes a physical interface, an electrical interface, and/or a data interface, but it is to be noted that an operable connection may include differing combinations of these or other types of connections sufficient to allow operable control.

"Signal", as used herein, includes but is not limited to one or more electrical or optical signals, analog or digital, one or more computer or processor instructions, messages, a bit or bit stream, or other means that can be received, transmitted and/or detected.

"Liquid" as used herein refers to a cooling fluid like fluorinets or other known cooling fluids like water, ethanol, ethanol/water mixture, alumina loaded slurries and so on.

A "liquid connection", or a connection by which entities may be in "liquid communication", is one by which a liquid can move to and/or from a first entity to a second entity.

A "detachable connection", or a connection by which entities may be "detachably connected", is one that facilitates attaching and detaching a first entity to a second entity. For example, a hose that is screwed onto a spigot is detachably connected. Similarly, an electrical receptacle configured to receive an electrical plug provides a detachable connection for the plug.

A "heat exchanger" is a type of cooling system in which one medium is used to carry heat off another medium. A heat exchanger may be, for example, a liquid to liquid heat exchanger, where a second liquid (e.g., cooling medium)

carries heat off a first liquid (e.g., heated medium) without direct contact between the liquids. A heat exchanger may also be, for example, a liquid to air heat exchanger, where air carries heat off a liquid without direct contact between the air and the liquid. In a heat exchanger, the heated medium is generally cooled towards the ambient temperature of the cooling medium.

A "sub-cooling element" is a type of cooling system in which a heat-conveying medium is cooled below ambient temperature of a surrounding environment. A sub-cooling element may be, for example, a refrigeration unit.

Figure 1:
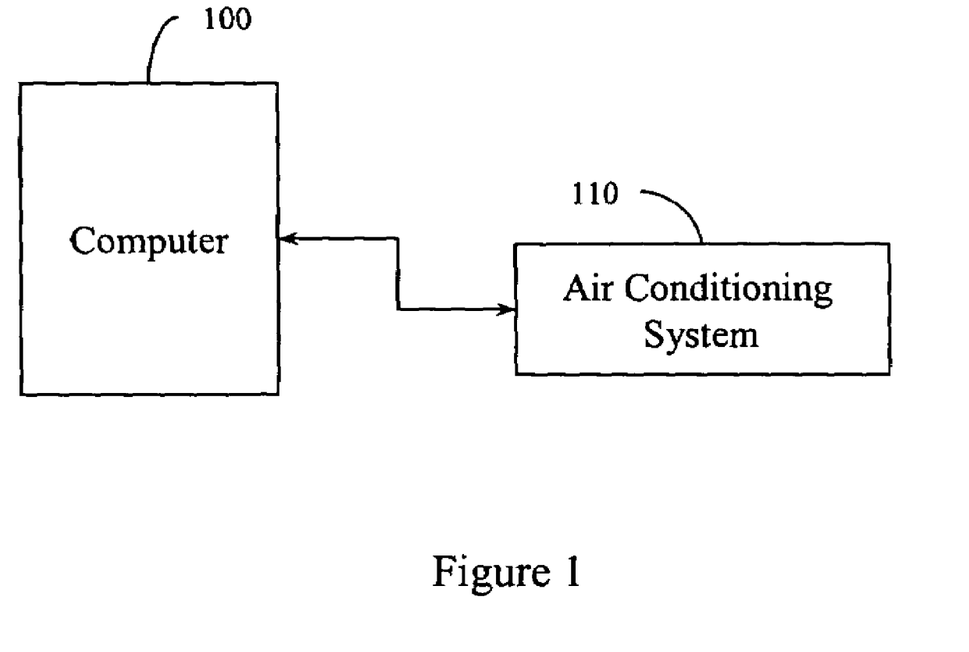
FIG. 1 illustrates a conventional air cooled system interacting with an air conditioning system.

FIG. 1 illustrates a conventional system that is air cooled. The system includes a computer 100 that interacts with an air conditioning system 110. The computer 100, or other electronics systems, may include various electronics components that generate heat. This heat is conventionally dissipated by exposing the heat generating component to air cooled by an air conditioning system. As heat dissipation requirements increase, a computer like computer 100 may overwhelm the air conditioning system 110. Thus, some computers are liquid cooled. While a single computer 100 is illustrated in FIG. 1, it is to be appreciated that the computer 100 may include several interconnected components that are mounted, for example, in a rack. Additionally, a rack may include several electronics modules that are not connected.

Figure 2:
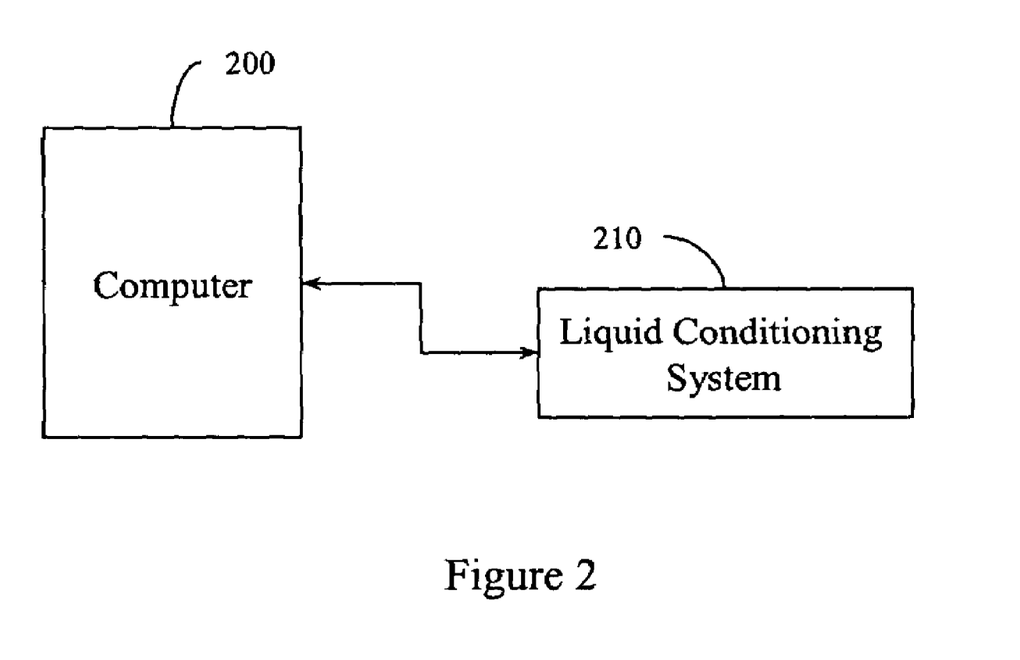
FIG. 2 illustrates a conventional liquid cooled system interacting with a liquid conditioning system.

FIG. 2 illustrates a conventional system that is liquid cooled. The system includes a computer 200 that interacts with a liquid conditioning system 210. The computer 200, or other electronics systems, may include various electronics components that generate heat. This heat is conventionally dissipated by liquid cooled by a liquid conditioning system. Once again it is to be appreciated that while a single computer 200 is illustrated in FIG. 2 that the computer 200 may include a set of interconnected components that are mounted, for example, in a rack.

Typically, systems like those illustrated in FIGS. 1 and 2 are either air cooled by air provided by an air conditioning system or liquid cooled by liquid provided by a liquid condition system. The example systems described herein facilitate designing electronics modules without considering whether the destination environment is air conditioned or liquid conditioned. Conventionally there is no migration path available between air cooled and liquid cooled systems, which limits system design, scalability, and flexibility. By way of illustration, if a facility is air conditioned, with no liquid conditioning capacity, then only air cooled components are likely to be placed in that facility. If the air cooled components require heat dissipation that nears or exceeds the capacity of the air conditioning system, then the air cooled system may incur limitations like, not being able to add more components to the system, not being able to upgrade the system (e.g., operate at higher clock speed), and so on. Thus, suboptimal actions like running a system at less than its capacity or having inadequate heat dissipation capacity are possible. Similarly, if a facility has liquid conditioning capacity, but no air conditioning capacity, then only liquid cooled components are likely to be placed in that facility. This either/or scenario may limit design flexibility, installation flexibility, scalability, and so on of computer and/or electronics systems in such facilities. For example, a server that is upgraded from an eight processor configuration to a sixty four processor configuration may generate more heat, which may increase heat dissipation requirements. These requirements may not be able to be met by an air conditioning system. If it is even possible, the facility in which the server is housed may have to be changed from an air-conditioned system to a liquid-conditioned system if the scaling is to occur. Thus, system design, flexibility, and scaling may be unnecessarily limited by cooling design and/or capacity.

In the conventional systems depicted in FIGS. 1 and 2, the air cooling of the electronics components in the computer 100 may have been designed in light of the air conditioning system 110. By way of illustration, electronic components may have been located on circuit boards so that heat sinks could be positioned near a particular surface of the computer 100 to maximize air flow provided by the air conditioning system 110. By way of further illustration, various electronic modules may have been mounted in a rack in a certain configuration to facilitate adequate airflow around the rack mounted modules. Similarly, the air conditioning system 110 may have been designed in light of the air cooling techniques employed in the computer 100. For example, if a certain type of heat sink was positioned in a certain location in the computer 100, air ducts may be located to direct conditioned air on or near that location. Thus, the design of the computer 100 and the design of the air conditioning system 110 may be unnecessarily intertwined, which can complicate design and limit future expansion paths. By way of illustration, a sixty four processor system may benefit from having conditioned air directed to different locations than an eight processor system. This could require relocating or reconstructing the air conditioning system 110 to accommodate the scaled up sixty four processor system.

The liquid conditioning system 210 may have been designed to interact with a specific computer 200. For example, plumbing locations, connector locations, liquid types and so on may have been chosen based on design features of the computer 200. When the computer 200 is replaced or scaled up, items including, but not limited to, plumbing locations, connector locations, connector types, liquid types, and liquid transporting means may need to be replaced. Similarly, the computer 200 may have employed a certain type of liquid cooling technique (e.g., cold plate, spray cooling) based on the liquid conditioning provided by the liquid conditioning system 210. Once again, the design of the computer 200 is unnecessarily intertwined with the design of the liquid conditioning system 210.

Figure 3:
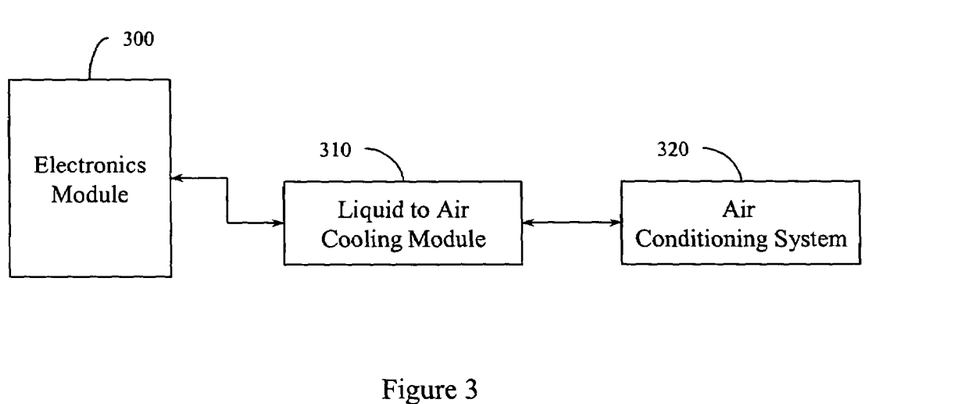
FIG. 3 illustrates an example system that includes a liquid cooled module.

FIG. 3 illustrates an example system that employs liquid cooled electronics modules and liquid cooling modules in a modular system architecture. The system includes a sealed electronics module 300 that may be liquid cooled. "Liquid cooled" means that the electronics module 300 may have components cooled by a liquid and/or may have heat generated by its components directly or indirectly dissipated into a liquid. Liquid cooling the electronics module 300 can provide greater heat dissipating capacity than is available by air cooling since the heat transfer capacity of some liquids can be, for example, thousands of times greater than the heat transfer capacity of a similar volume of air. By way of illustration, it may require 1,430 cfm of air to cool 10,000 Watts (W) of heat but only 0.27 cfm of liquid.

The electronics module 300 may be sealed with respect to attributes like electromagnetic interference. "Sealed", with respect to attributes like electromagnetic interference can mean that a percentage of electromagnetic waves that could otherwise affect one or more electronic components in the electronics module 300 are prevented from doing so. Additionally and/or alternatively, "sealed" with respect to electromagnetic interference can mean that electromagnetic magnetic waves generated by the electronics module 300 can be prevented from leaving the electronics module 300 and affecting other components. For example, the electronics module 300 may be shielded from electromagnetic interference by incorporating materials that absorb and/or reflect electromagnetic waves. In one example, "sealed" means that substantially all such waves are prevented from affecting electronic components within the electronics module 300. In another example, "sealed" means that substantially all such waves are prevented from leaving the electronics module 300. In one example, the module 300 is enclosed in a Faraday cage. Conventionally, an electronics module may not have been sealed due to factors including, but not limited to, requirements for the ingress/egress of air (e.g., air vents), requirements for ingress/egress of liquid (e.g., plumbing hoses), requirements for insertion/removal of expansion cards, and so on. Thus, interfering electromagnetic waves may have impacted the performance of the system being cooled. In some cases, the electromagnetic waves may have been produced by the air or liquid conditioning systems by, for example, high frequency motors. Additionally, and/or alternatively, the electronics module 300 may be sealed to facilitate reducing susceptibility to static electricity, condensation, foreign objects that may affect safety (e.g., fingers) and the like. Condensation may occur, for example, when the liquid cooling modules are sub-cooling elements.

Electronics components in the electronics module 300 may be cooled by a liquid. The liquid used to cool the electronics components can be transported away from the electronics module 300 to a cooling module 310 by various apparatus (e.g., pipes, hoses, motors). In one example, the cooling module 310 is a liquid to air cooling module detachably connected to the electronics module 300 by flexible tubing. In a rack mounted system, the electronics module 300 may be racked, for example, in a first slot in the rack while the cooling module 310 may be racked, for example, in a second slot in the rack. With the detachable connections, the electronics module 300 and the cooling module 310 may be repositioned in the rack. Similarly, the electronics module 300 may be racked in a first rack while the cooling module 310 may be racked in a second rack so long as the electronics module 300 and the cooling module 310 can be brought into liquid communication.

The cooling module 310 may be, for example, a heat exchanger, a sub-cooling element, and so on. Liquid to cool the electronics components in the electronics module 300 may be transported from the cooling module 310 to the electronics module 300 by various apparatus like pipes, hoses, motors and so on. The plumbing interface between the electronics module 300 and the cooling module 310 can be, for example, conventional liquid transporting apparatus like pipes, hoses, conduit, circulating motors, and the like. Thus, the electronics module 300 may have connectors that facilitate establishing liquid communication, by detachable connections, between the electronics module 300 and the cooling module 310. The connectors may facilitate detachably connecting, for example, hoses for transporting liquid between the electronics module 300 and the cooling module 310.

In one example, the electronics module 300 may have a "heat dissipation rating". This rating can describe the amount of heat that the electronics module 300 needs to have dissipated. Thus, the cooling module 310 can be selected based on the dissipation rating and the external interface of the electronics module 300 rather than on the internal construction or design of the electronics module 300. Reducing the linkage between electronics system design and cooling system design may facilitate producing systems that are more configurable and scalable, providing evolutionary upgrade paths, and responding, in a timely manner, to changing destination environments.

In FIG. 3, the cooling module 310 is a liquid to air cooling module. Thus, heat carried away from the electronics module 300 by the liquid is transferred to air associated with the cooling module 310. This heat may then be dissipated by, for example, an air conditioning system 320. In this way, the liquid cooling provided to the electronics module 300 is decoupled from the air conditioning system 320, which facilitates placing liquid cooled systems in air conditioned facilities. Once again, decoupling electronics system design from heat dissipation design by using liquid cooled system modules may facilitate producing systems that are more configurable and scalable with more evolutionary upgrade paths.

Figure 4:
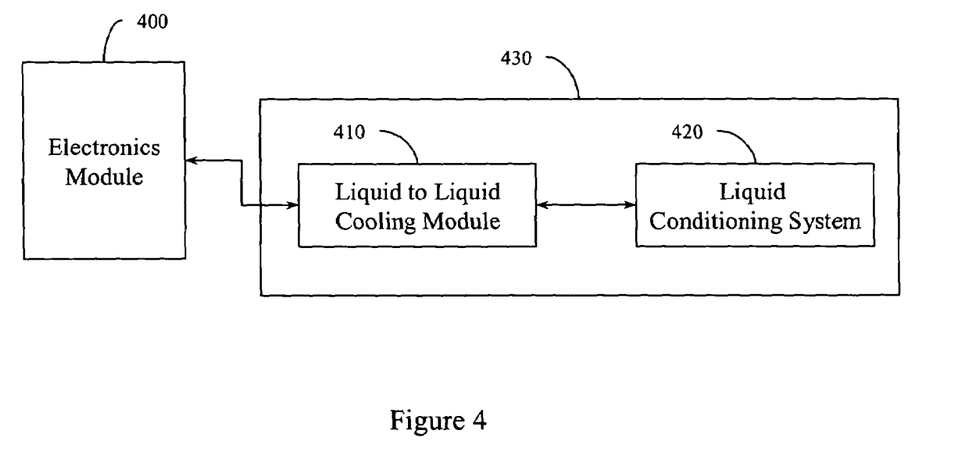
FIG. 4 illustrates an example system that includes a liquid cooled module.

FIG. 4 illustrates another example modular liquid cooled system architecture. In FIG. 4, a sealed electronics module 400 is in liquid communication with a cooling module 410 that is in turn in liquid communication with a liquid conditioning system 420. In one example, the electronics module 400 could be substantially identical to the electronics module 300. Thus, a facility housing the electronics module 400 or a system that includes a number of such modules could be changed from air conditioning to liquid conditioning without changing the electronics module 400. Additionally, and/or alternatively, electronics modules can be provided to various types of facilitates (e.g., liquid conditioned, air conditioned) without redesigning and/or reconfiguring the electronics modules. Comparing FIGS. 3 and 4 illustrates that the design of the electronics modules 300 and 400 has been decoupled from the design of the medium conditioning system (e.g., air or liquid) located downstream. The electronics modules 300 and 400 can be designed to interact with a cooling module that can service heat dissipation requirements. Thus, the electronics modules 300 and 400 can be designed independent of associated liquid cooling components so long as the interface (e.g., connector availability) is implemented. In FIG. 3, the cooling module 310 is a liquid to air cooling module that interacts with the air conditioning system 320. In FIG. 4, the cooling module 410 is a liquid to liquid cooling module that interacts with the liquid conditioning system 420. As long as the heat dissipation requirements can be met, the electronics module 300 could be switched with the electronics module 400. This enhances configurability as compared to conventional systems that require either air conditioning or liquid conditioning.

In FIG. 4, the cooling module 410 and the liquid condition system 420 are illustrated as separate components. It is to be appreciated that the cooling module 410 and the conditioning system 420 could be a single unit 430 and/or contained within a single unit 430. Similarly, the liquid to air cooling module 310 and the air conditioning system 320 could be a single unit and/or contained within a single unit.

Figure 5:
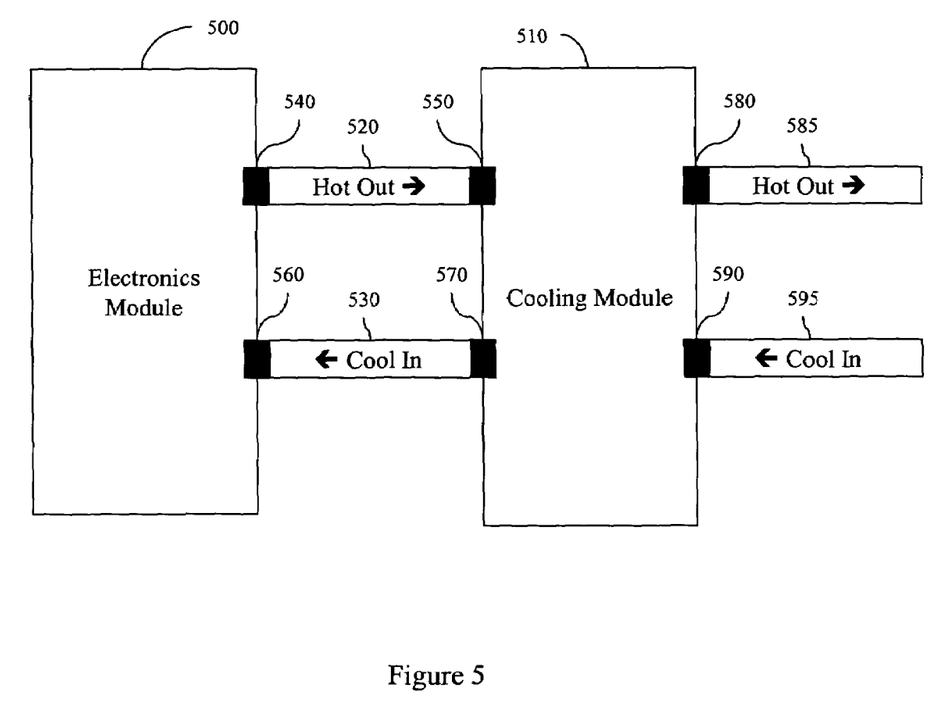
FIG. 5 illustrates example detachable liquid connections between an example electronics module and an example cooling module.

FIG. 5 illustrates an example sealed electronics module 500 interacting with an example cooling module 510 through example liquid connections 540 and 560. The sealed electronics module 500 may include electronics components. The electronics components may be arranged within (e.g., inside) the electronics module 500. The electronics components can include, but are not limited to, a microprocessor, a memory chip, a controller chip, and power subsystem components. Thus, various configurations of electronic components are possible which facilitates using the electronics module 500 as part of a scaleable electronics system. For example, the scaleable electronics system may be a server that can be dynamically configured from eight to one hundred and twenty eight processors by adding electronics modules like the electronics module 500. While eight and one hundred and twenty eight processors are described, it is to be appreciated that a greater and/or lesser number of processors and/or other electronic components can be employed. These electronic components may be cooled by techniques including, but not limited to, cold plates, spray techniques, spray evaporation techniques, and the like.

The electronics module 500 may be sealed with respect to, for example, electromagnetic interference. Thus, the electronics module 500 can be protected from electromagnetic waves present in the environment and/or those generated by, for example, the cooling module 510, an air conditioning system, a liquid conditioning system, and the like. Similarly, the electronics module 500 can be sealed with respect to electromagnetic interference to prevent waves that the module 500 generates from affecting other components. In one example, the module 500 may be encased in a Faraday cage. In another example, the module 500 may be sealed with respect to nuclear, biological and/or chemical agents.

The electronics module 500 may also be sealed with respect to, for example, noise. Thus a quieter system may be produced. Furthermore, the electronics module 500 may be sealed with respect to contaminants like airborne materials (e.g., dust, zinc). This can make the electronics module 500 less sensitive to the data center environment. By way of illustration, airborne zinc particles may enter a non-sealed module. These zinc particles may form into "zinc whiskers" that can negatively impact electronics. Sealing the electronics module 500 from such airborne zinc facilitates mitigating issues associated with such "zinc whiskers". Being less sensitive to the data center environment (e.g., air temperature) may also facilitate achieving more precise temperature control within the sealed module 500. While "zinc whiskers" are described, it is to be appreciated that the electronics module 500 can be sealed from other contaminants.

The electronics module 500 may also include connectors (e.g., 540, 560) configured to provide detachable connections to apparatus for transporting liquid. The liquid transporting apparatus provide liquid communication between the sealed electronics module 500 and the external liquid cooling module 510. The liquid transporting apparatus can include, for example, plumbing and circulating pumps. The connectors may have types including, but not limited to, screw type, plunger type, male/female type, jaws type, quick disconnect types, and so on. A first connector 540 may, for example, connect a pipe 520 that is connected to a connector 550 on the cooling module 510. The pipe 520 may, for example, transport relatively warmer liquid from the electronics module 500 to the cooling module 510 for heat dissipation. The relatively warmer liquid may have been employed directly and/or indirectly in cooling electronics components in the electronics module 500. Similarly, a second connector 560 may, for example, connect a pipe 530 that is connected to a connector 570 on the cooling module 510. The pipe 530 may, for example, transport relatively cooler liquid from the cooling module 510 to the electronics module 500. The relatively cooler liquid may be employed to cool electronics components in the electronics module 500. While two connectors 540 and 560 are illustrated, it is to be appreciated that a greater number of connectors may be employed. Similarly, while pipes are described, it is to be appreciated that other liquid transporting apparatus like hoses, conduit, and the like may be employed.

The electronics module 500 may also include apparatus for cooling the electronics components in the electronics module 500. The apparatus may include, for example, cold plates, heat exchangers, and the like. The apparatus may employ liquid that is transported between the electronics module 500 and the external liquid cooling module 510 to cool the electronics components. Note that the cooling module 510 is physically separate from the electronics module 500, and detachably connected by, for example, pipes, hoses, pumps, and so on that facilitate transporting liquid between the two modules. The liquid transported between the two modules may directly and/or indirectly cool the electronics components in the electronics module 500.

The electronics module 500 can be designed independently of the cooling module 510. In one example, the electronics module 500 can be configured to be operably connected to one or more second sealed electronics modules. In this way a system can be scaled up, dynamically configured, dynamically reconfigured, and so on, substantially without regard to the cooling system design. For example, if the electronics module 500 were located in a rack, other components could be added to the rack, operably connected to the module 500 and a more powerful system produced. Similarly, since the electronics module 500 has an interface associated with providing cooling liquid, in one example the sealed electronics module 500 may be configured to be in liquid communication with one or more second sealed electronics modules. In this way, one liquid cooling module may service heat dissipation requirements of a set of electronics modules. Thus, an example modular nature of a system architecture that employs liquid cooled system modules is revealed. An electronics module can be a "processing building block" of a system and a cooling module can be a "heat dissipation building block" of the system, where the building blocks can be independently designed and then detachably connected.

While FIG. 5 illustrates pipes 520 and 530 connected to a single cooling module 510, it is to be appreciated that in one example plumbing can transport liquid from the electronics module 500 to one or more liquid cooling modules. Concerning connections to downstream components, the cooling module 510 illustrates one pipe 585 connected to a connector 580 for conveying heat out of the cooling module 510. It is to be appreciated that a greater number of connectors and/or transporting apparatus can be employed. Similarly, while the cooling module 510 illustrates one pipe 595 connected to a connector 590 for conveying a cool medium into the cooling module 510, a greater number of connectors and/or transporting apparatus can be employed. Note that the design of the liquid cooled electronics module 500 is independent of the component(s) located downstream of the cooling module 510. The downstream component could be an air conditioning system, a liquid conditioning system, and so on, without altering the design of the liquid cooled electronics module 500.

The cooling module 510 may include connectors configured to provide detachable connections to liquid transporting apparatus (e.g., pipes, conduits, compressors, pumps, motors) that facilitate providing liquid communication between the liquid cooling module 510 and the sealed electronics module 500. Internally, the cooling module 510 may include apparatus for receiving a liquid to be cooled (e.g., a reservoir, a chamber, a vacuum pump) and apparatus for providing a cooled liquid back to the sealed electronics module 500 via the liquid transporting apparatus. The providing apparatus can include, for example, a reservoir, a pump, a motor, an impeller, a propeller, a compressor, and other such apparatus known in the art. The cooling module 510 may also include apparatus for cooling the received liquid. This apparatus can be a variety of items known in the art like heat exchangers and refrigeration equipment. The cooling module 510 may also include apparatus for dissipating heat transferred to liquid cooling module 510 when cooling the received liquid. For example, the cooling module 510 may interface with an air conditioning system, a liquid conditioning system, ambient air, and so on. The apparatus for dissipating heat can include a variety of items known in the art like heat exchangers, heat sinks, and the like.

While the cooling module 510 is illustrated with connections available to a heat dissipation system like an air conditioning system or a liquid conditioning system, in one example, the cooling module 510 may be configured to be in liquid communication with another liquid cooling module (s). For example, three liquid cooling modules may be arranged in series to facilitate providing the heat dissipation requirements of an electronics module while accommodating various power and/or space requirements in a facility. For example, a long low room with only 110V power may be available for locating cooling modules. Thus, rather than a tall cooling module that requires 220V power, a series of three shorter 110V units may be employed. Additionally, and/or alternatively, while cooling module 510 is illustrated with connections available to a heat dissipation system, the heat dissipation system may be incorporated into the module 510.

Figure 6:
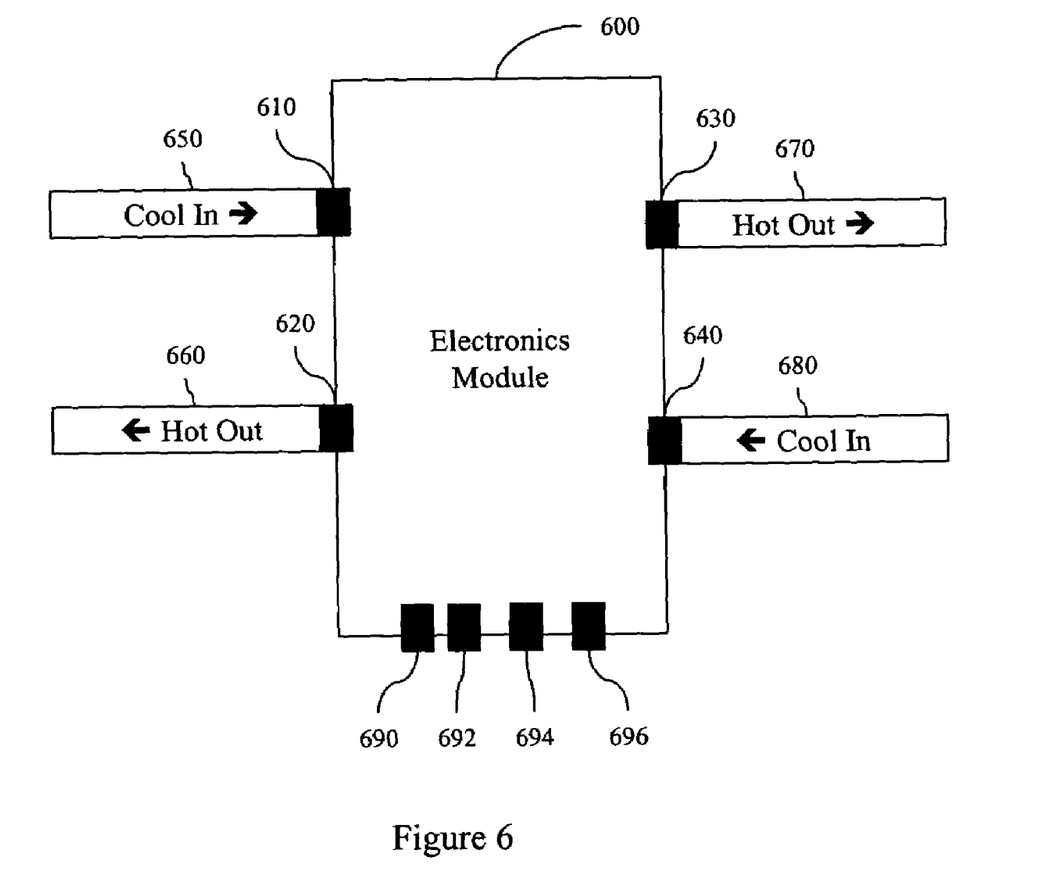
FIG. 6 illustrates example detachable liquid and operable connections on an example electronics module.

FIG. 6 illustrates an electronics module 600 with various connectors that facilitate establishing detachable liquid and operable connections. For example, connectors 690, 692, 694, and 696 can dynamically form detachable operable connections between the electronics module 600 and another electronic module(s). The connectors 690 through 696 may, for example, connect the electronics module 600 to one or more other electronics modules rack mounted in the same chassis as electronics module 600. In this way, the electronics module 600 can be used as a modular component (e.g., building block) in a configurable, scalable system. For example, the electronics module 600 may be an eight microprocessor system that could be connected by connectors 690, 692, 694, and/or 696 to another eight microprocessor system to make a sixteen microprocessor system. While four connectors 690, 692, 694, and 696 are illustrated, it is to be appreciated that a greater and/or lesser number of connectors can be employed.

The electronics module 600 also may include a number of connectors like connectors 610, 620, 630, and 640 that facilitate establishing detachable liquid connections with one or more liquid cooling modules. The connectors 610 through 640 may, for example, connect the electronics module 600 to one or more liquid cooling modules rack mounted in the same chassis as electronics module 600. For example connectors 630 and 640 may transport liquid to and from a liquid to air cooling module via apparatus 670 and 680. Similarly, connectors 610 and 620 may transport liquid to and from a liquid to liquid cooling module via apparatus 650 and 660. While four connectors 610, 620, 630, and 640 are illustrated, it is to be appreciated that a greater and/or lesser number of connectors could be employed. Having a number of connectors available for forming detachable liquid connections to various cooling modules facilitates isolating electronics module design from cooling system design. The various connectors facilitate establishing multiple paths to multiple cooling modules for handling the heat dissipation requirements of an electronics module. Thus, a specification for the electronics module 600 may include not only its heat dissipation rating, but data identifying the number and type of connectors available for plumbing. Similarly, having a number of connectors available for forming detachable operable connections to various other electronics modules (liquid cooled or otherwise) facilitates employing the electronics module 600 in a dynamically configurable, scalable system. Thus, a specification for the electronics module 600 may also include data identifying the number and type of connectors available for establishing operable connections.

Figure 7:
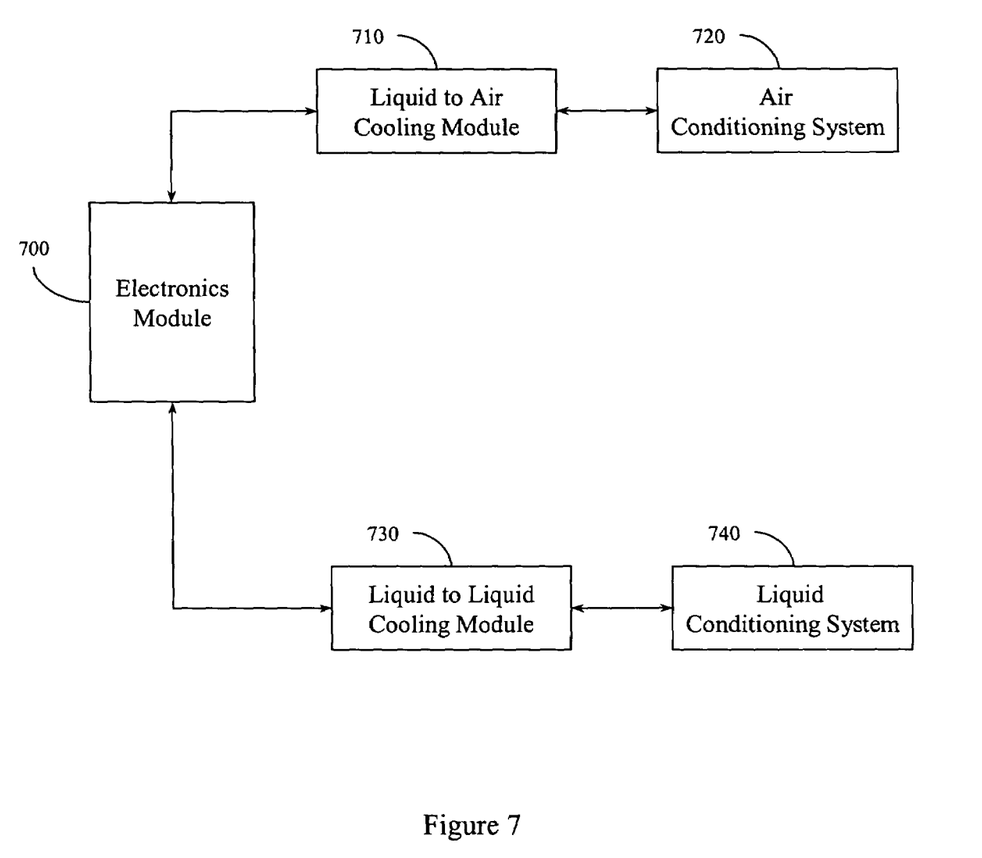
FIG. 7 illustrates an example electronics module interacting with a plurality of example cooling modules.

FIG. 7 illustrates an example electronics module 700 interacting with a liquid to air cooling module 710 being serviced by an air conditioning system 720. The electronics module 700 is also interacting with a liquid to liquid cooling module 730 being serviced by a liquid conditioning system 740. In one example, the modules 700 and 710 could be rack mounted in a single chassis. This is an example of a more general situation where an electronics module could interact with N cooling modules, N being an integer. The cooling modules may be of different types, capacities, and so on. The electronics module 700 may interact with both the cooling modules 710 and 730 during, for example, a peak heat dissipation demand period. At another time, the electronics module 700 may interact with the liquid to liquid cooling module 730 during a lower range heat dissipation demand period and may interact with the liquid to air cooling module 710 during an even lower range heat dissipation demand period. Additionally, and/or alternatively, the electronics module 700 may interact with one cooling module while the other cooling module is being serviced. Or, the electronics module 700 may employ a first cooling module as a primary system and have the other cooling module available as a backup system. Thus, FIG. 7 illustrates flexibility associated with a liquid cooled system module that is supplied by a "black box" downstream cooling component. This flexibility facilitates building redundancy into a system. The redundancy could be employed in a fail-over system that included, for example, N cooling modules, N being an integer, to cool one or more electronics modules. The fail-over system may also include an additional cooling module, for a total of N+1 cooling modules. Thus, if a cooling module failed, the additional module could be brought on line.

In FIG. 7, the liquid to air cooling module 710 is serviced by the air conditioning system 720. It is to be appreciated that the air conditioning system 720 may be, for example, a computer room air conditioning (CRAC) system. The CRAC system may have, for example, components located indoors and components located outdoors. However, the number, type, location, and so on of the components in the air conditioning system 720 is substantially irrelevant to the design and implementation of the electronics module 700, so long as the heat dissipation requirements of the electronics module 700 are serviced. Similarly, the liquid to liquid cooling module 730 is serviced by the liquid conditioning system 740. Once again, the number, type, location, and so on of the components in the liquid conditioning system 740 is substantially irrelevant to the design and implementation of the electronics module 700, so long as the heat dissipation requirements of the electronics module 700 are serviced.

Figure 8:
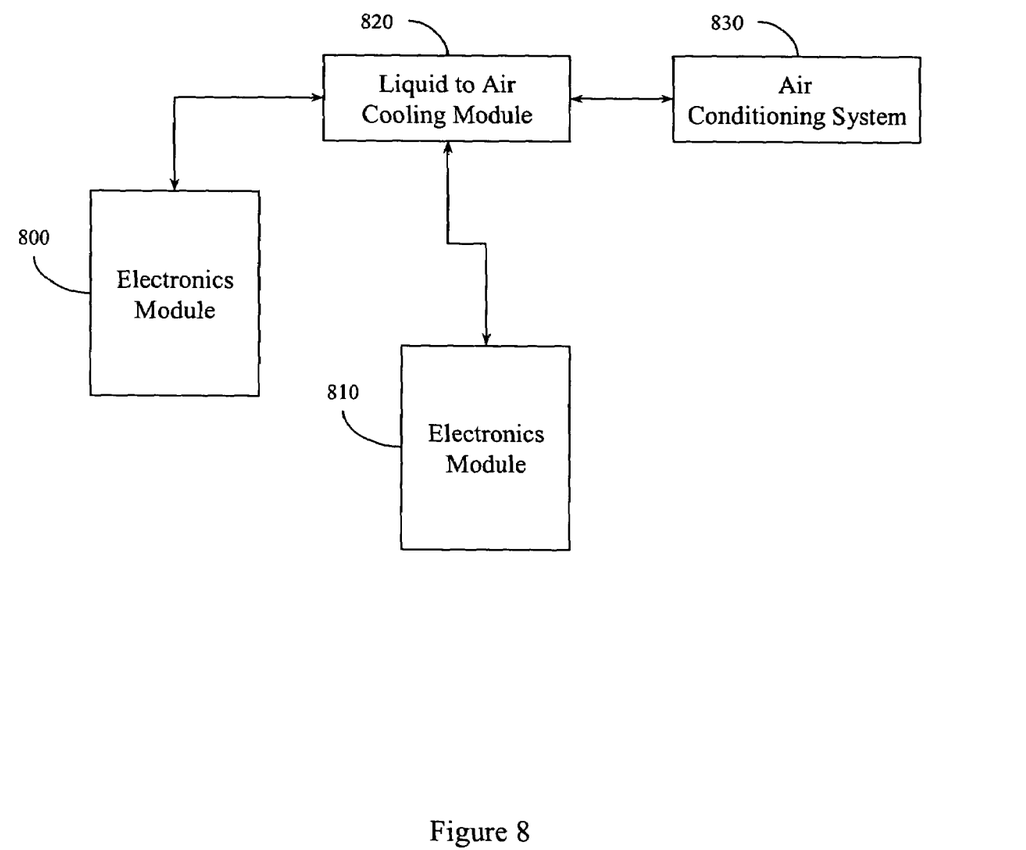
FIG. 8 illustrates an example cooling module interacting with a plurality of example electronics modules.

FIG. 8 illustrates two example electronics modules 800 and 810 having their heat dissipation requirements being serviced by a single cooling module 820. In one example, modules 800, 810 and 820 could be rack mounted in a single chassis and/or rack mounted in two or more chassis. This is an example of a more general situation where a single cooling module could service the heat dissipation requirements of M electronics modules, M being an integer. Whether a single cooling module 820 is employed to satisfy the heat dissipation requirements of the electronics modules 800 and 810 is substantially irrelevant to the electronics modules 800 and 810. Similarly, so long as connectors and heat dissipation capacity are available, it is substantially irrelevant to the cooling module 820 whether it is servicing the heat dissipation requirements of one or more than one electronics module. Furthermore, the location in the rack of the various modules is substantially irrelevant. While the liquid to air cooling module 820 is illustrated interacting with the air conditioning system 830, it is to be appreciated that the cooling module 820 could be, for example, a liquid to liquid cooling module interacting with a liquid conditioning system.

Figure 9:
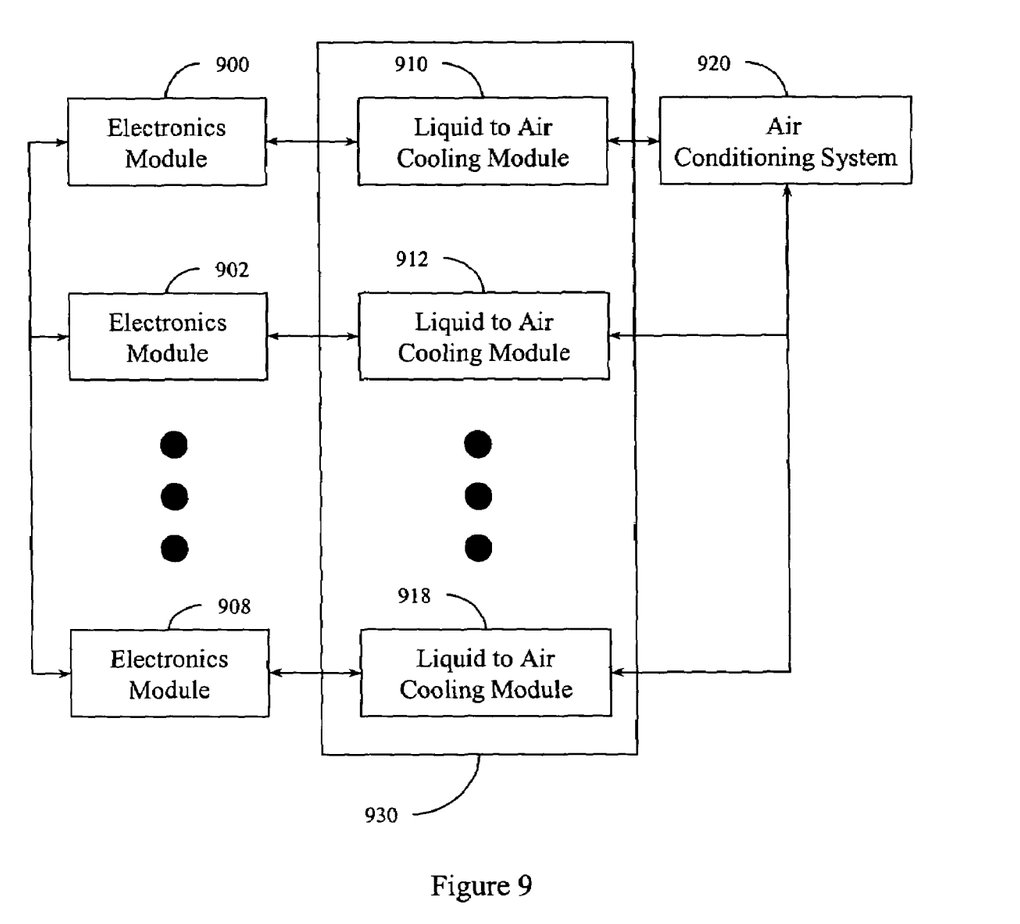
FIG. 9 illustrates an example scaled up electronics architecture interacting with a plurality of example cooling modules.

FIG. 9 illustrates an example scaled up electronics architecture interacting with a set of liquid cooling modules. The scaled up electronics architecture includes electronics modules 900 through 908. The electronic modules 900 through 908 may be, for example, communicating, co-operating computer components configured into a parallel processing architecture. The electronics modules 900 through 908 could be arranged, for example, in a rack. The scaled up electronics architecture may implement, for example, a sixty four processor server system made up of eight electronics modules. The electronics modules 900 through 908 may be operably connected by, for example, a backplane or a set of high speed cables. The electronics modules 900 through 908 may be racked together in one or more chassis, stacked directly, and/or networked together, for example.

The scaled up electronics architecture has an overall heat dissipation requirement. Rather than designing a single heat dissipater, however, a modular approach based on servicing liquid for the modular electronics components 900 through 908 may be taken. Thus, a cooling module 910 is illustrated servicing the heat dissipation requirements of the electronics module 900. Similarly, the cooling modules 912 through 918 are illustrated servicing the heat dissipation requirements of the electronics modules 902 through 908. In one example, the cooling modules 912 through 918 may be arranged in a rack 930. Thus, the design of the scaled up architecture can be decoupled from the design of the heat dissipation system. Furthermore, the scaled up architecture is substantially unaware that the liquid cooling modules 910 through 918 are in turn being serviced by a downstream air conditioning system 920. While the cooling modules 910 through 918 are illustrated as a homogenous set of liquid to air cooling modules, it is to be appreciated that a variety of liquid to air, liquid to liquid, and other liquid cooling modules could service the heat dissipation requirements of the electronics modules in the scaled up architecture.

Figure 10:
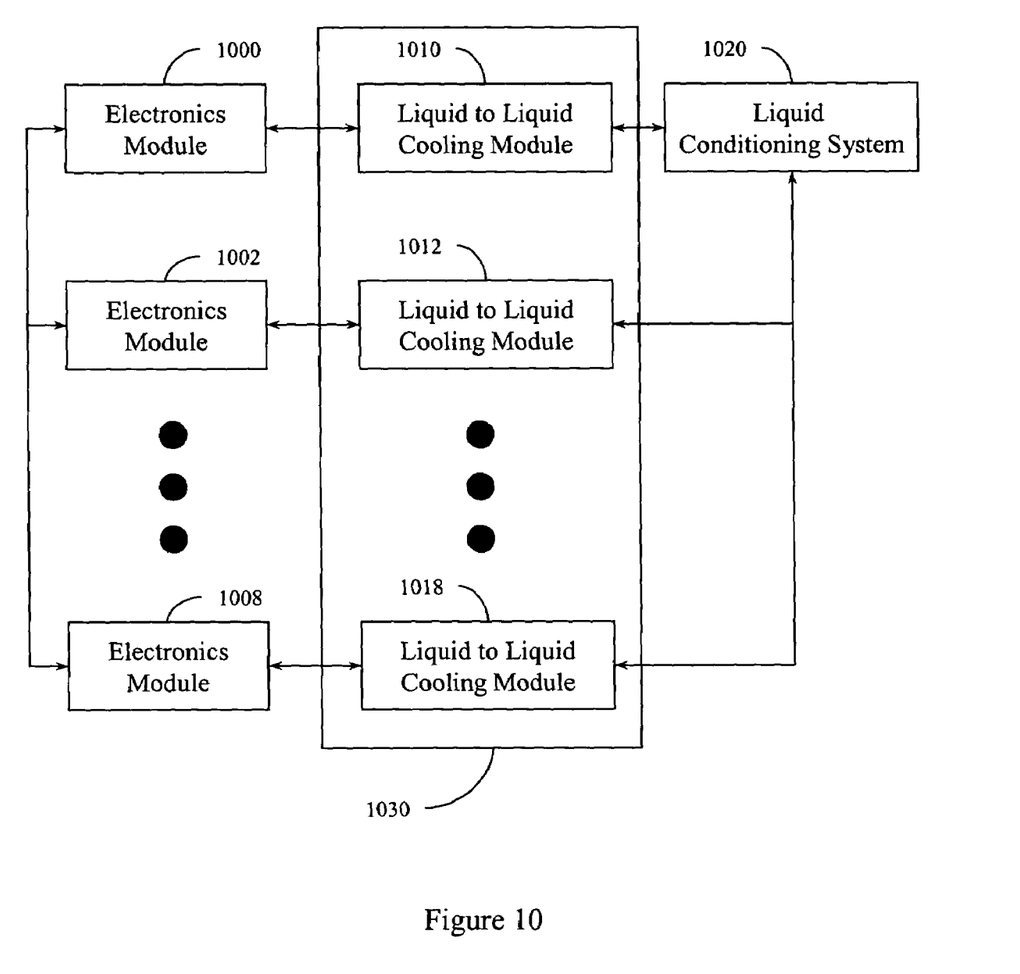
FIG. 10 illustrates an example scaled up electronics architecture interacting with a plurality of example cooling modules.

While FIG. 9 illustrates a scaled up architecture being serviced by a set of liquid to air cooling modules serviced by the air conditioning system 920, FIG. 10 illustrates a scaled up architecture of electronics modules 1000 through 1008 being serviced by a set of liquid to liquid cooling modules 1010 through 1018. It is to be appreciated that the example systems described herein can be employed in these various environments. The scaled up architecture includes electronics modules 1000 through 1008 that may be operably connected by, for example, a backplane or set of cables. The electronics modules 1000 through 1008 may be racked together in one or more chassis, stacked directly, and/or networked together, for example. The set of liquid to liquid cooling modules 1010 through 1018 may in turn be serviced by a liquid conditioning system 1020. Assume that the set of electronic modules 1000 through 1008 are the set of modules 900 through 908 from FIG. 9. After the scaled up architecture has been completed, the facility housing these electronics modules may be changed from air conditioning to liquid conditioning. Thus, the air conditioning system 920 may be removed and the liquid conditioning system 1020 may be added. If the liquid cooling modules 1010 through 1018 were arranged in, for example, a rack 1030, then part of the changeover could include changing out rack 930 and changing in rack 1030. This change may be accomplished without reconfiguring the scaled up architecture. Changing out the air conditioning system 920 would involve replacing the liquid to air cooling modules 910 through 918 with the liquid to liquid cooling modules 1010 through 1018, but, once again, may not involve reconfiguring, reprogramming, relocating or so on the scaled up architecture and/or its electronics modules.

Thus, FIGS. 9 and 10 illustrate an electronics system that includes liquid cooled sealed electronics modules. The electronics modules may be sealed from, for example, electromagnetic interference, noise, contaminants, and so on. A sealed electronics module may include, for example, one or more electronics components. The electronics components may include, but are not limited to, a microprocessor, a memory chip, a controller chip, and a power subsystem component. The electronics components may be arranged, for example, inside the sealed electronics module. The electronics modules may also include connectors configured to provide detachable connections to liquid transporting apparatus. The liquid transporting apparatus (e.g., pipes, hoses, conduit, pumps, motors, compressors, impellers) may provide liquid communication between a sealed electronics module and an external liquid cooling module. Thus, liquid from a cooling module can be used to dissipate heat generated in the sealed electronics module by, for example, one or more of the electronics components. The sealed electronics module may also include apparatus for cooling the electronics components using liquid that is transported between the sealed electronics module and the external liquid cooling module. The apparatus may include, for example, cold plates and spray coolers.

The liquid cooled electronics system may also include liquid cooling modules. A liquid cooling module may include connectors configured to provide detachable connections between the liquid cooling module and the liquid transporting apparatus that provide liquid communication between the liquid cooling module and the sealed electronics module(s). A liquid cooling module may also include apparatus for receiving a liquid to be cooled, apparatus for cooling the received liquid, and apparatus for providing the cooled liquid back to the sealed electronics modules via the liquid transporting apparatus. Various receiving, cooling, and providing apparatus (e.g., reservoirs, heat exchangers, refrigeration units) known in the art may be employed. In one example, one or more sealed electronics modules and one or more liquid cooling modules may be arranged in one or more rack mounted systems like that illustrated in FIG. 13.

Since a cooling module receives heat carried off the electronics components in the electronics modules, a cooling module may include apparatus for dissipating this carried off heat. Once again, the dissipating apparatus can be of various types known in the art (e.g., heat exchangers). In FIGS. 9 and 10, liquid cooling modules and sealed electronics modules are physically separated, which facilitates reducing design interdependence. Furthermore, in FIGS. 9 and 10, sealed electronics modules are configured to be dynamically operably connected by a detachable connection to other liquid cooled electronics modules. This facilitates employing sealed electronics modules in dynamically configurable scalable architectures. In one example, sealed electronics modules are further configured to be in liquid communication with other sealed electronics modules, providing even more design flexibility.

Figure 11:
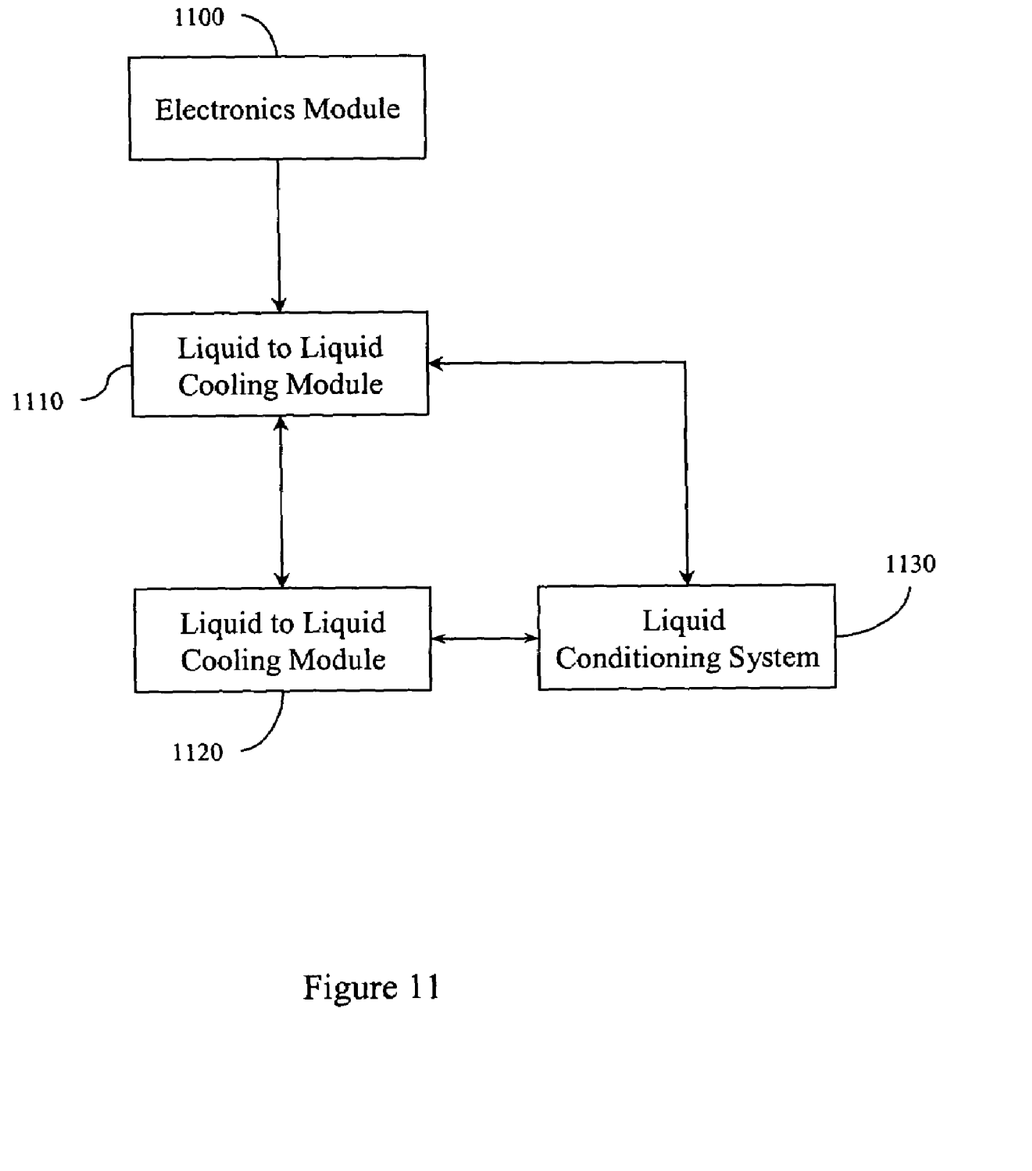
FIG. 11 illustrates an example electronics module having its heat dissipation needs serviced by two cooling modules.

As described above, liquid cooling modules can be arranged "in series" and/or "in parallel" to facilitate handling the heat dissipation requirements of an electronics module. Thus, FIG. 11 illustrates an electronics module 1100 being serviced by a first liquid to liquid cooling module 1110 and a second liquid to liquid cooling module 1120. In one example, liquid cooling module 1110 is serviced by liquid cooling module 1120 while liquid cooling module 1120 is serviced by liquid conditioning system 1130. In another example, both liquid cooling modules 1110 and 1120 are serviced by the liquid conditioning system 1130. This modular design, which uses liquid cooled system modules, facilitates decoupling electronics module design and configuration from heat dissipation design and configuration, which facilitates scaling and dynamically configuring electronic systems. It is to be appreciated that electronics module 1100 and cooling modules 1110 and 1220 could be rack mounted similar to the components illustrated in FIG. 13.

Figure 12:
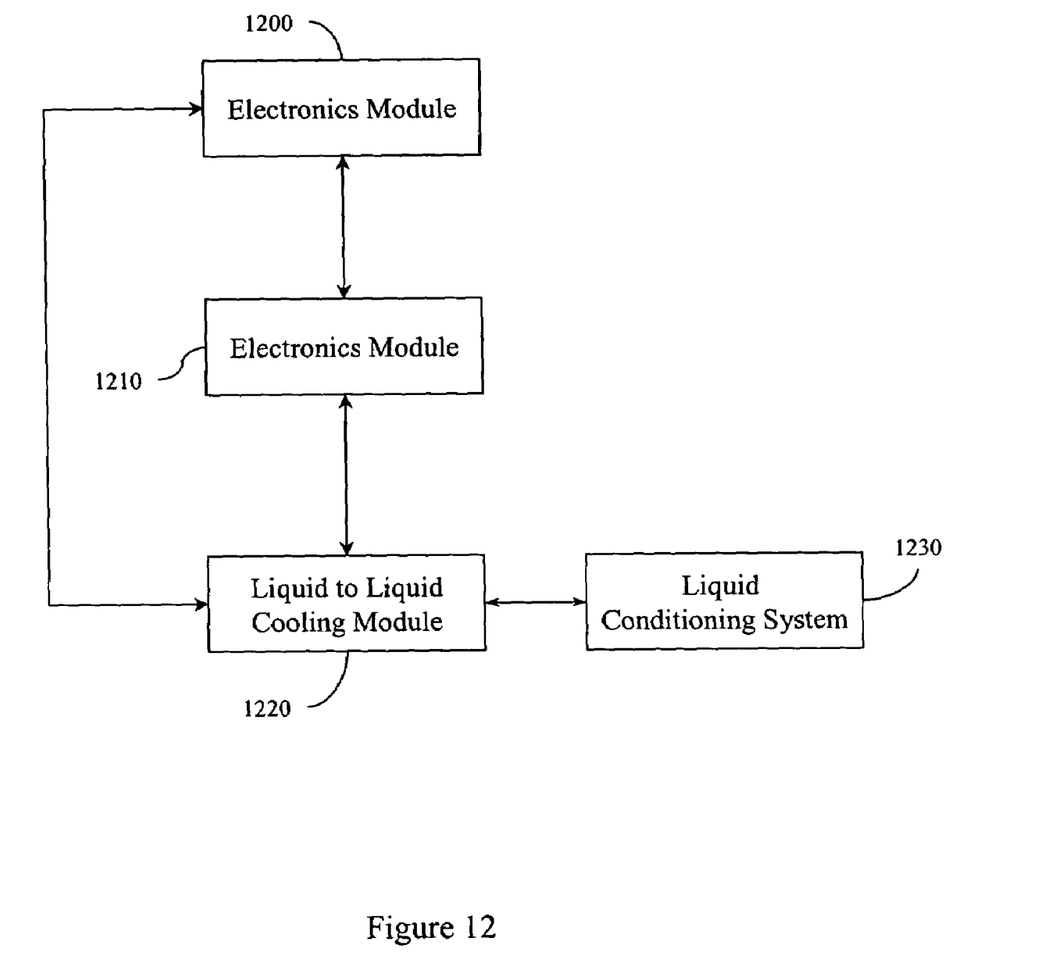
FIG. 12 illustrates an example cooling module servicing the heat dissipation needs of two electronics modules.

Similarly, FIG. 12 illustrates a first electronics module 1200 arranged in series with a second electronics module 1210 where both are being serviced by a liquid to liquid cooling module 1220. The liquid to liquid cooling module 1220 is in turn being serviced by a liquid condition system 1230. In another example, the first electronics module 1200 could also be connected to liquid to liquid cooling module 1220. Once again this modular design that uses liquid cooled system modules facilitates decoupling electronics module design and configuration from heat dissipation design and configuration, which facilitates designing dynamically configurable, scalable systems with flexible, evolutionary migration paths. It is to be appreciated that electronics modules 1200 and 1210 and cooling module 1220 could be rack mounted similar to the components illustrated in FIG. 13.

Figure 13:
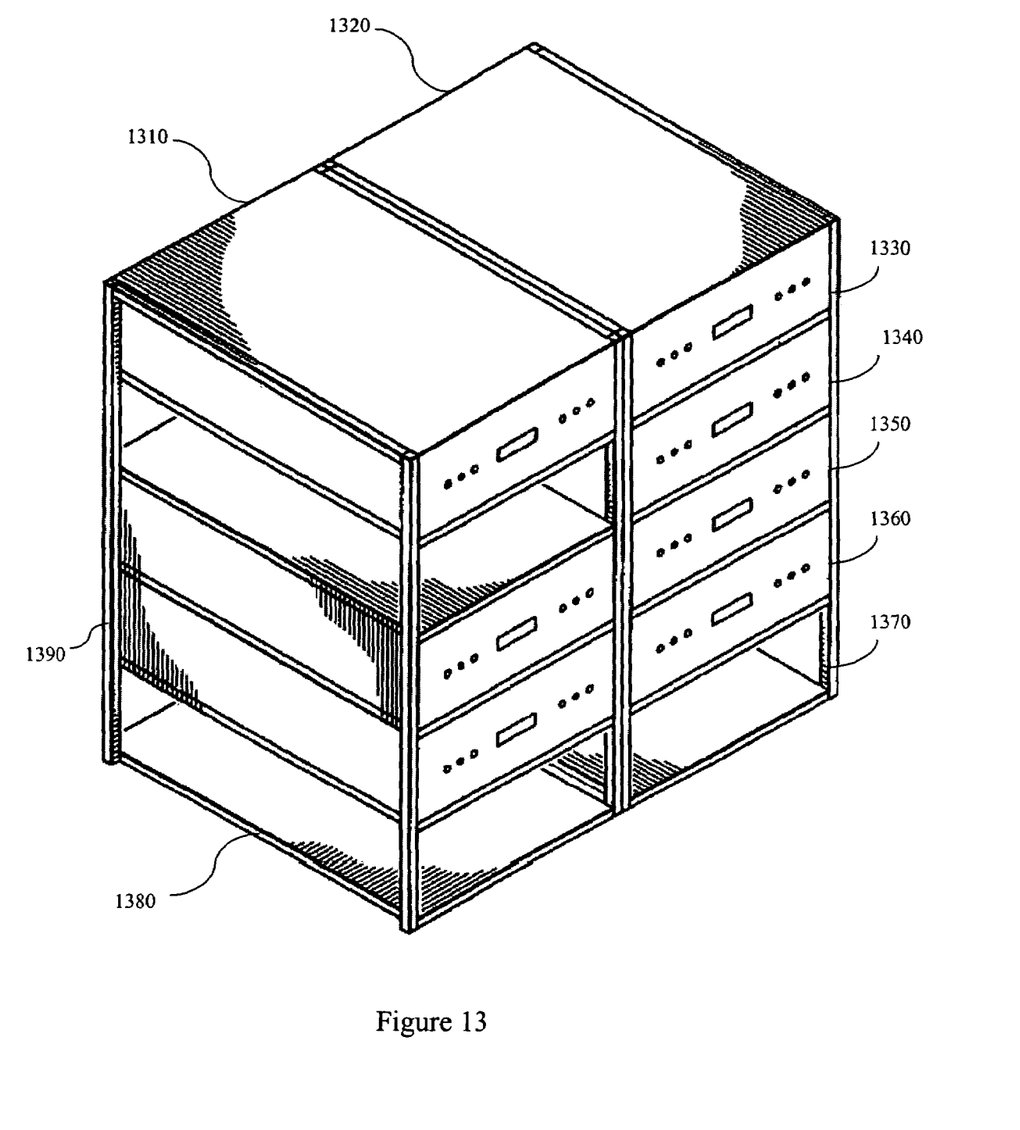
FIG. 13 illustrates a rack mounted configuration in which systems that employ the example systems described herein may be installed.

FIG. 13 illustrates an example architecture that employs two racks. A first rack 1310 has five bays. A second rack 1320 also has five bays. Bays 1330, 1340, 1350, and 1360 are occupied by liquid cooling modules. Bay 1370 is empty and thus could accept another liquid cooling module, a liquid cooled electronics module, and/or other type of apparatus (e.g., air cooled module). Bay 1380 is empty while bay 1390 and other bays in rack 1310 are occupied by electronics modules. The electronics modules in rack 1310 may be connected into one scaled up system and/or may be independently operating machines. Regardless of their electronic connections to other electronics modules, the electronics modules in rack 1310 can be brought into liquid communication with one or more liquid cooling modules in rack 1320. Thus, the heat dissipation requirements of the electronics modules in rack 1310 can be met by rack mounted cooling modules in rack 1320. While electronics modules are illustrated in rack 1310 and cooling modules are illustrated in rack 1320, it is to be appreciated that the electronics modules and/or cooling modules could be located in other bays and/or other racks. Similarly, while two racks are illustrated, a greater and/or lesser number of racks may be employed. Furthermore, while racks are illustrated, other apparatus for locating and/or organizing components can be employed.

While the example systems have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the example systems employed in systems that employ liquid cooled modules. Additional advantages and modifications will readily appear to those skilled in the art. Therefore, the invention, in its broader aspects, is not limited to the specific details, the representative apparatus, and illustrative examples shown and described. Accordingly, departures may be made from such details without departing from the spirit or scope of the applicants' general inventive concept. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "having" is employed in the detailed description or the claims, it is intended to be inclusive in a manner similar to the term "comprising" as that term is interpreted when employed as a transitional word in a claim. Furthermore, to the extent that the term "or" is employed in the claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A liquid cooled modular electronics system, comprising: one or more sealed electronics modules, a sealed electronics module including: one or more electronics components arranged within the sealed electronics module; one or more connectors attached to the sealed electronics module, the connectors configured to provide one or more detachable connections between the sealed electronics module and liquid transporting means for providing liquid communication between the sealed electronics module and one or more external liquid cooling modules; and means arranged within the sealed electronics module for dissipating heat generated by one or more of the one or more electronics components using liquid that is transported between the sealed electronics module and the external liquid cooling module; and one or more liquid cooling modules, a liquid cooling module including: one or more connectors attached to the liquid cooling module, the connectors configured to provide one or more detachable connections between the liquid cooling module and the liquid transporting means; means arranged within the liquid cooling module for receiving a liquid to be cooled; means arranged within the liquid cooling module for cooling the liquid to be cooled into a cooled liquid; means arranged within the liquid cooling module for providing the cooled liquid to one or more sealed electronics modules via the liquid transporting means; and means arranged within the liquid cooling module for dissipating heat transferred to the liquid cooling module from the liquid to be cooled; where the one or more liquid cooling modules and the one or more sealed electronics modules are separate modules that can be selectively connected together by the one or more detachable connections to establish liquid communication therebetween, and where the one or more sealed electronics modules are configured to be dynamically operably connected by a detachable connection to the one or more second liquid cooling electronics modules, and where the one or more sealed electronics modules and the one or more liquid cooling electronics modules are to be positioned in a single rack.

2. A liquid cooled modular electronics system, comprising: one or more sealed electronics modules, a sealed electronics module including: one or more electronics components arranged within the sealed electronics module; one or more connectors attached to the sealed electronics module, the connectors configured to provide one or more detachable connections between the sealed electronics module and liquid transporting means for providing liquid communication between the sealed electronics module and one or more external liquid cooling modules; and means arranged within the sealed electronics module for dissipating heat generated by one or more of the one or more electronics components using liquid that is transported between the sealed electronics module and the external liquid cooling module; and one or more liquid cooling modules, a liquid cooling module including: one or more connectors attached to the liquid cooling module, the connectors configured to provide one or more detachable connections between the liquid cooling module and the liquid transporting means; means arranged within the liquid cooling module for receiving a liquid to be cooled; means arranged within the liquid cooling module for cooling the liquid to be cooled into a cooled liquid; means arranged within the liquid cooling module for providing the cooled liquid to one or more sealed electronics modules via the liquid transporting means; and means arranged within the liquid cooling module for dissipating heat transferred to the liquid cooling module from the liquid to be cooled; where the one or more liquid cooling modules and the one or more sealed electronics modules are separate modules that can be selectively connected together by the one or more detachable connections to establish liquid communication therebetween, where the one or more sealed electronics modules are individually sealed with respect to electromagnetic interference and where the one or more sealed electronics modules and the one or more liquid cooling modules are to be positioned in a single rack mounting system.

3. A liquid cooled modular electronics system, comprising: two or more sealed electronics modules, a sealed electronics module including: one or more electronics components arranged within the sealed electronics module; one or more connectors attached to the sealed electronics module, the connectors configured to provide one or more detachable connections between the sealed electronics module and liquid transporting means for providing liquid communication between the sealed electronics module and one or more external liquid cooling modules; and means arranged within the sealed electronics module for dissipating heat generated by one or more of the one or more electronics components using liquid that is transported between the sealed electronics module and the external liquid cooling module; and two or more liquid cooling modules, a liquid cooling module including: one or more connectors attached to the liquid cooling module, the connectors configured to provide one or more detachable connections between the liquid cooling module and the liquid transporting means; means arranged within the liquid cooling module for receiving a liquid to be cooled; means arranged within the liquid cooling module for cooling the liquid to be cooled into a cooled liquid; means arranged within the liquid cooling module for providing the cooled liquid to one or more sealed electronics modules via the liquid transporting means; and means arranged within the liquid cooling module for dissipating heat transferred to the liquid cooling module from the liquid to be cooled; where the two or more liquid cooling modules and the two or more sealed electronics modules are separate modules that can be selectively connected together by the one or more detachable connections to establish liquid communication therebetween, where two or more liquid cooling modules are configured in a redundant failover system, and where the two or more liquid cooling modules and the two or more sealed electronics modules are configured to be arranged in a single rack.

* * * * *